(12) United States Patent
Miro Panades

(10) Patent No.: US 10,454,486 B2
(45) Date of Patent: Oct. 22, 2019

(54) FREQUENCY LOCKED LOOP WITH FAST VOLTAGE/FREQUENCY TRANSITION

(71) Applicant: Commissariat à l'Energie Atomique et aux Energies Alternatives, Paris (FR)

(72) Inventor: Ivan Miro Panades, Grenoble (FR)

(73) Assignee: COMMISSARIAT ÀL'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/134,599

(22) Filed: Sep. 18, 2018

(65) Prior Publication Data
US 2019/0089363 A1    Mar. 21, 2019

(30) Foreign Application Priority Data

Sep. 19, 2017 (FR) .................. 17 58666

(51) Int. Cl.
| | | |
|---|---|---|
| H03L 7/099 | (2006.01) |
| G06F 1/10 | (2006.01) |
| G06F 1/08 | (2006.01) |
| G06F 1/324 | (2019.01) |
| G06F 1/3296 | (2019.01) |
| H03L 7/10 | (2006.01) |

(52) U.S. Cl.
CPC .............. *H03L 7/0992* (2013.01); *G06F 1/08* (2013.01); *G06F 1/10* (2013.01); *G06F 1/324* (2013.01); *G06F 1/3296* (2013.01); *H03L 7/104* (2013.01)

(58) Field of Classification Search
CPC ......... H03L 7/0992; H03L 7/99; H03L 7/093; H03L 7/081; H03L 7/0991; H03L 7/087; H03L 7/18; H03L 7/06; H03L 1/04

USPC ......... 327/156, 158, 161; 375/371, 374, 375
See application file for complete search history.

(56) References Cited

U.S. PATENT DOCUMENTS 5,861,766 A    1/1999 Baumer et al.
9,057,775 B2 *  6/2015 Kobayashi ............ G01S 13/345
(Continued)

FOREIGN PATENT DOCUMENTS

EP    0669722 A2    8/1995

OTHER PUBLICATIONS

Preliminary Research Report for French Application No. 1758666, dated Jul. 20, 2018, 2 pages.

*Primary Examiner* — John W Poos
(74) *Attorney, Agent, or Firm* — Moreno IP Law LLC

(57) ABSTRACT

The invention concerns a circuit comprising: a voltage generator adapted to generate a variable supply voltage for powering a processing core; a frequency generator adapted to generate a variable frequency clock signal of the processing core and comprising a frequency locked loop having: a digitally controlled oscillator configured to generate the variable frequency clock signal; and a controller (614) configured to generate a digital control signal (C_FREQ), wherein the controller is configured to implement a frequency transition of the variable frequency clock signal from a first frequency to a second lower frequency by generating: a first value of the digital control signal (C_FREQ) to apply a first reduction in the frequency of the variable frequency clock signal to a third frequency lower than the second frequency; and further values of the digital control signal (C_FREQ).

10 Claims, 3 Drawing Sheets

(56) References Cited

U.S. PATENT DOCUMENTS 9,350,365 B2 * 5/2016 Familia ................ H03L 7/0991
2015/0188549 A1 7/2015 Puschini et al.

* cited by examiner

FREQUENCY LOCKED LOOP WITH FAST VOLTAGE/FREQUENCY TRANSITION

FIELD

The present disclosure relates to the field of Dynamic Voltage and Frequency Scaling (DVFS), and in particular to a voltage generator and frequency generator providing relatively fast voltage/frequency transitions.

BACKGROUND

Dynamic Voltage and Frequency Scaling (DVFS) has been used for a number of years to increase microprocessor performance in terms of speed and computational capabilities. For example, it has been proposed to define Voltage and Frequency Islands (VFI) in an integrated circuit. DVFS techniques can then be applied to these islands in order to locally control the supply voltage and clock frequency of the islands during runtime in order to minimize power consumption while satisfying the computation and throughput requirements. Such a technique is for example discussed in the publication by Suzanne Lesecq et al, entitled "Low-cost and robust control of a DFLL for multi-processor system-on-chip", proceedings of the 18$^{th}$ World Congress of the International Federation of Automatic Control, Milano (Italy) Aug. 28-Sep. 2, 2011.

The modification of the frequency of an island of an integrated circuit implies modifying the frequency generated by a PLL (Phase Locked Loop) or an FLL (Frequency Locked Loop). Both PLLs and FLLs require a certain convergence period for the output frequency to stabilize at the desired level. However, during this convergence period, power efficiency is generally poor.

There is therefore a need in the art for a circuit allowing relatively rapid voltage/frequency transitions and providing relatively good power efficiency.

SUMMARY

It is an aim of embodiments of the present description to at least partially address one or more difficulties in the prior art.

According to one aspect, there is provided a circuit comprising: a voltage generator adapted to generate a variable supply voltage for powering a processing core; a frequency generator adapted to generate a variable frequency clock signal of the processing core, wherein the frequency generator comprises a frequency locked loop comprising: a digitally controlled oscillator configured to generate the variable frequency clock signal; and a controller configured to generate a digital control signal for controlling the digitally controlled oscillator based on the product of a frequency error signal and a gain, the controller being configured to implement a frequency transition of the variable frequency clock signal from a first frequency to a second frequency lower than the first frequency by generating: a first value of the digital control signal based on a first value of the gain applied to a first value of the frequency error signal to apply a first reduction in the frequency of the variable frequency clock signal to a third frequency lower than the second frequency; and further values of the digital control signal based on one or more further gain values that are for example different to and lower than the first value of the gain, the controller for example being configured to apply the further gain values selected such that the second frequency is not exceeded by the variable frequency clock signal.

According to one embodiment, the voltage generator is configured to implement a voltage transition from a first level of the variable supply voltage to a second level lower than the first level following said first frequency reduction.

According to one embodiment, the controller is adapted to apply the first value of the gain that causes an overshoot of between 10 and 30 percent of the frequency difference between the first and second frequencies.

According to one embodiment, the controller is configured to apply the further gain values selected such that the second frequency is not exceeded by the variable frequency clock signal.

According to one embodiment, the circuit further comprises: a frequency counter configured to generate an estimate of the frequency of the variable frequency clock signal based on a reference clock signal; and a subtractor adapted to generate the frequency error signal by subtracting the frequency estimate from the second frequency.

According to one embodiment, the digitally controlled oscillator comprises a digital to analog converter and a voltage controlled oscillator.

According to one embodiment, the circuit further comprises a gain control circuit adapted to receive a frequency control signal indicating the second frequency and to determine when the frequency transition is a frequency reduction.

According to one embodiment, the gain control circuit is configured to detect when a frequency transition is not a frequency reduction and in response to cause the controller to apply a gain value not leading to overshoot of the second frequency.

According to a further aspect, there is provided an electronic device comprising: the processing core; and the above circuit adapted to provide the variable supply voltage and variable frequency clock signal to the processing core.

According to a further aspect, there is provided a method of performing a voltage and frequency transition of a processing core, the method comprising: implementing, by a controller of a frequency locked loop, a frequency transition of the variable frequency clock signal from a first frequency to a second frequency lower than the first frequency by generating: a first value of a digital control signal based on a first gain value applied to a first value of a frequency error signal to apply a first reduction in the frequency of the variable frequency clock signal to a third frequency lower than the second frequency; and further values of the digital control signal based on one or more further gain values that are for example different to and lower than the first value of the gain, the controller for example being configured to apply the further gain values selected such that the second frequency is not exceeded by the variable frequency clock signal; and applying the digital control signals to a digitally controlled oscillator to generate the variable frequency clock signal.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION OF THE PRESENT EMBODIMENTS

While embodiments of the present disclosure will be described in relation with an FLL based on the "backward Euler" control technique, it will be apparent to those skilled in the art that the principles described herein can be applied to any type of FLL having a DCO (digitally controlled oscillator) and a feedback path.

Figure 1:
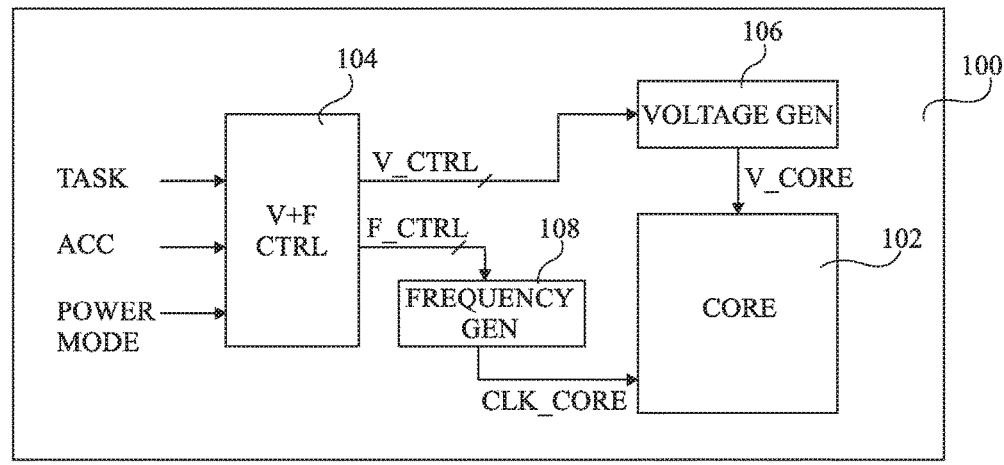
FIG. 1 schematically illustrates an electronic device comprising DVFS circuitry according to an example embodiment.

FIG. 1 schematically illustrates an electronic device 100 comprising DFVS circuitry. For example, the device 100 comprises a data processing core (CORE) 102 powered by a variable supply voltage V_CORE and clocked by a variable clock signal CLK_CORE. The data processing core 102 for example corresponds to a Voltage and Frequency Island (VFI), as defined above.

A voltage and frequency control circuit (V+F CTRL) 104 controls the supply voltage and clock frequency of the core 102 based on computational requirements, and for example based on a given task or software code to be executed (TASK), a required accuracy level of the computation (ACC), and/or a power mode of the electronic device (POWER MODE), e.g., "low power", "normal power", "high power" etc. For example, the control circuit 104 generates a voltage control signal V_CTRL, which is provided to a voltage generator (VOLTAGE GEN) 106 responsible for generating the supply voltage V_CORE of the processing core, and a frequency control signal F_CTRL to a frequency generator (FREQUENCY GEN) 108 responsible for generating the clock signal CLK_CORE of the processing core 102.

The processing core 102 could be a micro-processor or micro-controller, DSP (digital signal processor), or any other data processing circuit clocked by a clock signal. While only one processing core 102 is illustrated in FIG. 1, in alternative embodiments there could be more than one processing core, each receiving a variable supply voltage generated by a corresponding voltage generator and a variable clock signal generated by a corresponding frequency generator.

Figure 2:
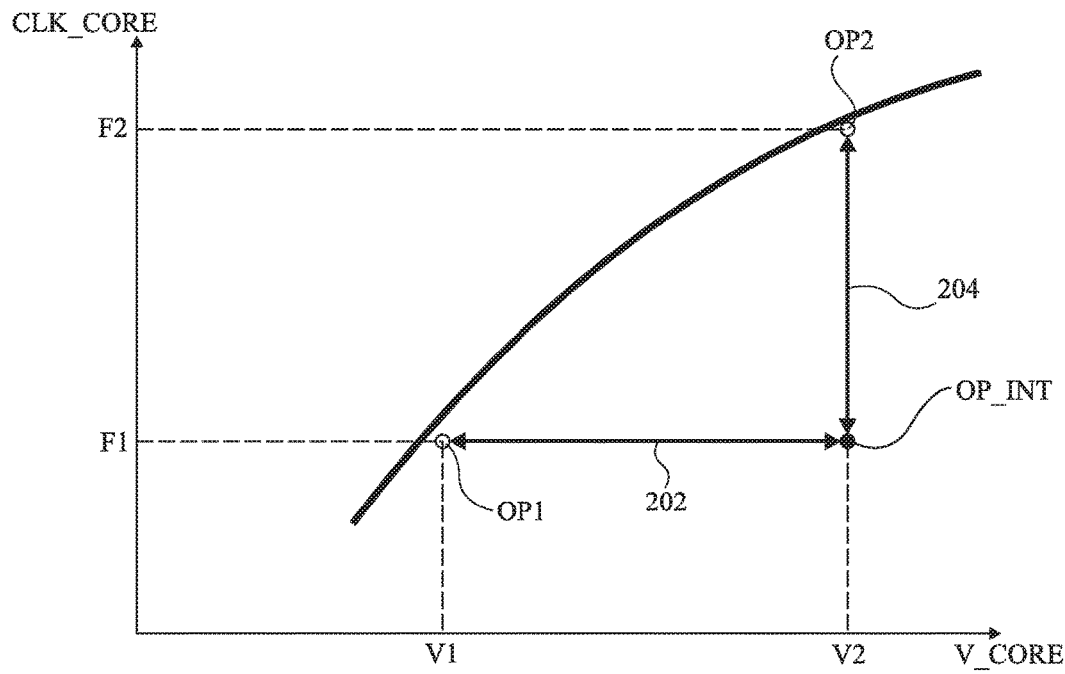
FIG. 2 is a graph illustrating a frequency/voltage transition according to an example embodiment.

FIG. 2 is a graph representing a frequency/voltage transition of the clock signal CLK_CORE and supply voltage V_CORE of the processing core 102 according to an example embodiment. In the example of FIG. 2, there is for example a relatively low power operating point OP1 associated with a clock frequency F1 and supply voltage V1, and a relatively high performance operating point OP2 associated with a clock frequency F2 higher than F1 and a supply voltage V2 higher than V1.

It should be noted that the frequency/voltage settings at each operating point OP1, OP2 are close to optimal as regards the path propagation delays in the circuit and timing of the clock edges. In particular, there is for example relatively little slack time, in other words there is a low time margin between data transitions and clock edges in the various circuit paths of the processing core. Therefore, when transitioning between operating points, to avoid timing faults, the supply voltage should generally be increased before any increase in the clock frequency, and the clock frequency should be reduced before any reduction in the supply voltage.

For example, when moving from the operating point OP1 to the operating point OP2, the supply voltage V_CORE is for example first increased from the level V1 to the higher level V2 as represented by the arrow 202. The frequency of the clock signal CLK_CORE is then increased from the initial frequency F1 to the higher frequency F2 as represented by the arrow 204.

When moving from the operating point OP2 to the operating point OP1, the frequency of the clock signal CLK_CORE is first decreased from the frequency F2 to the lower frequency F1 as represented by the arrow 204. The supply voltage V_CORE is then decreased from the level V2 to the lower level V1 as represent by the arrow 202.

Thus a voltage/frequency transition in FIG. 2 involves passing through an intermediate operating point OP_INT at which the clock frequency and supply voltage are non-optimal. This leads to power inefficiency.

Figure 3:
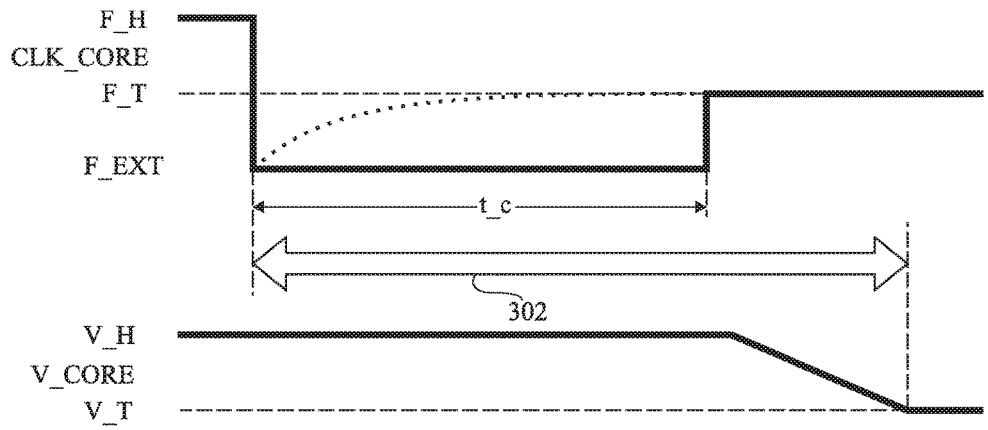
FIG. 3 is a timing diagram illustrating a frequency transition using a PLL according to an example embodiment of the present disclosure.

FIG. 3 is a timing diagram illustrating an example of the frequency of the clock signal CLK_CORE and the supply voltage level V_CORE of the processing core 102 of FIG. 1 in the case that a PLL is used to implement the frequency generator 108. It is assumed that the clock frequency is initially at a level F_H and is to fall to a target level F_T, and that the voltage is initially at a level V_T and is to fall to a target level V_T.

The clock frequency is first reduced down to a level F_EXT of an external clock having a relatively low frequency. The PLL then takes a certain convergence time t_c to lock onto the target frequency F_T. It is only once this target frequency F_T has been reached that the supply voltage V_CORE can be reduced from the level V_H to the target level V_T. Therefore, there is a relatively long period represented by an arrow 302 in FIG. 3 during which there is power inefficiency. Indeed, during a first period, the frequency is at the relatively low level of F_EXT, while the supply voltage remains at the relatively high level of V_H, and during a second period the frequency is at the target frequency F_T while the voltage reduces from the level V_H towards the target level V_T.

Rather than being implemented by a PLL, in alternative embodiments the frequency generator 108 could be implemented by a frequency locked loop (FLL), as will now be described with reference to FIGS. 4 and 5.

Figure 4:
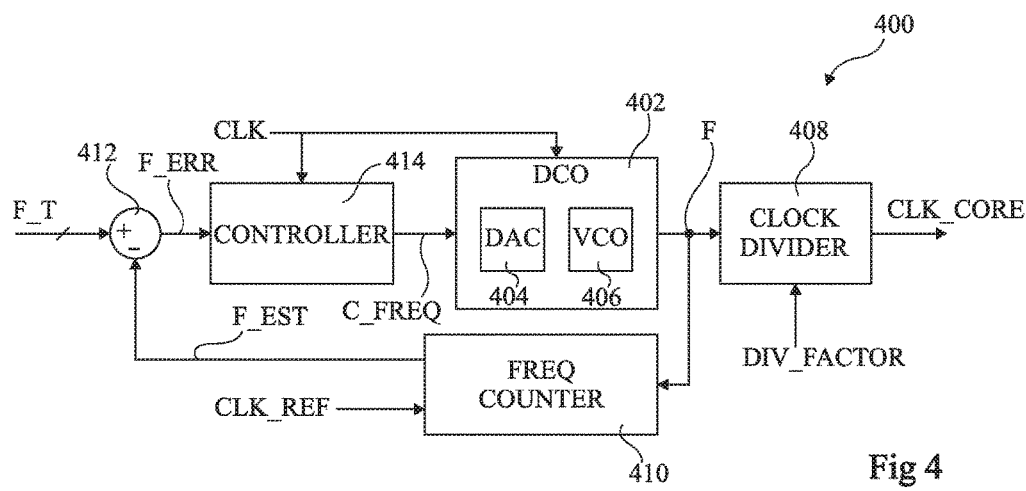
FIG. 4 schematically illustrates an FLL according to an example embodiment.

FIG. 4 schematically illustrates an example of an FLL 400, which is for example used to implement the frequency generator 108 of FIG. 1. The FLL 400 is based on the "backward Euler" control technique. The circuit comprises a digitally controlled oscillator (DCO) 402, which for example comprises a digital to analogue converter 404 and a voltage controlled oscillator (VCO) 406. The DCO 402 outputs a frequency signal F, which is for example provided to a clock divider (CLOCK DIVIDER) 408. The clock divider 408 receives, at a further input, a division factor DIV_FACTOR, indicating a desired ratio between the frequency signal F and the output frequency signal CLK_CORE of the circuit.

The frequency signal F is also provided to a frequency counter (FREQ COUNTER) 410, which receives a reference clock signal CLK_REF, estimates the frequency of the frequency signal F and provides this estimate F_EST to a subtractor 412. The subtractor 412 also receives the target frequency F_T, and generates an error signal F_ERR based on the difference between the estimated frequency F_EST and the target frequency F_T. The error signal F_ERR is provided to a controller (CONTROLLER) 414. The controller 414 generates, based on the error signal F_ERR, a digital frequency control signal C_FREQ, which is provided to the DCO 402 in order to adjust the frequency of the frequency signal F. In particular, the DAC 404 of the DCO 402 for example converts the digital frequency control signal C_FREQ into an analog voltage level, which is used to control the oscillation frequency of the VCO 406.

The controller 414 and DCO 402 are for example clocked by a clock signal CLK.

The controller 414 for example generates the control signal C_FREQ based on the equation:

C_FREQ(i+1)=C_FREQ(i)+F_ERR*GAIN where C_FREQ(i+1) is the new value of the control signal C_FREQ, C_FREQ(i) is the previous value of the control signal C_FREQ, and GAIN is a gain value set to a fixed value to ensure stability.

Figure 5:
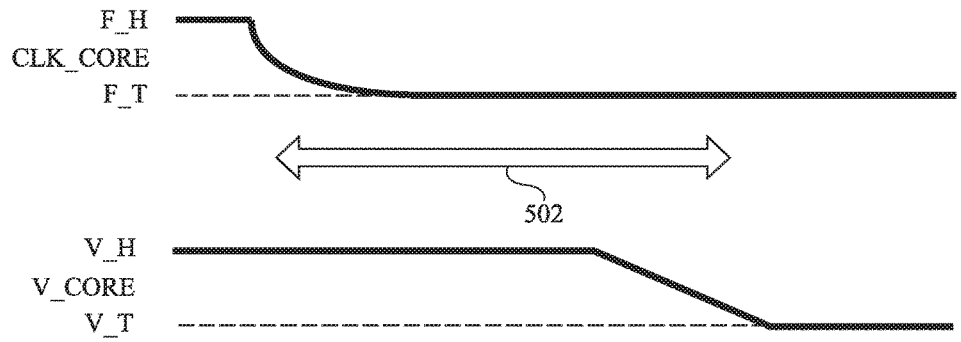
FIG. 5 is a timing diagram illustrating a frequency transition using the FLL of FIG. 4 according to an example embodiment.

FIG. 5 is a timing diagram representing the frequency of the clock signal CLK_CORE and the level of the voltage signal V_CORE during a frequency/voltage transition according to example embodiment in which the frequency generator 108 is implemented by the FLL 400 of FIG. 4. Like in the example of FIG. 3, it is assumed that the frequency is initially at a relatively high level F_H, and is to transition to a lower target level F_T and the voltage is to transition from a voltage level V_H to a voltage level V_T. In the case of an FLL, a clock signal converging towards a target frequency can continue to be used to clock the processing core 102. However, only once the frequency has locked onto the target frequency F_T can the voltage of the processing core be reduced from the level V_H to the level V_T, and therefore during the convergence period represented by an arrow 502 in FIG. 5, there will be power inefficiency.

To address this power inefficiency, according to the embodiments described herein, the frequency generator 108 is for example modified as will now be described with reference to FIG. 6.

Figure 6:
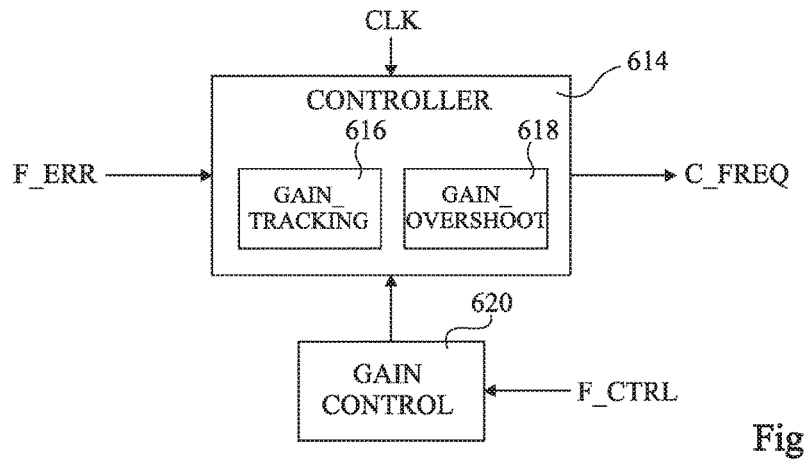
FIG. 6 schematically illustrates a controller of the FLL of FIG. 4 in more detail according to an embodiment of the present disclosure.

The frequency generator 108 is for example implemented by a similar FLL to the one of FIG. 4, except that the controller 414 of FIG. 4 is replaced by a controller (CONTROLLER) 614 of FIG. 6. The controller 614 for example generates the control signal C_FREQ based on the following equation:

C_FREQ(i+1)=C_FREQ(i)+F_ERR*GAIN_V where C_FREQ(i+1) is the new value, of the control signal C_FREQ, C_FREQ(i) is the previous value of the control signal C_FREQ, F_ERR is the error between the current frequency and the target frequency and GAIN_V is a variable gain value that for example has one of two types of gain, a first gain type being referred to herein as a tracking gain (GAIN_TRACKING), and a second gain type being referred to herein as an overshoot air GAIN_OVERSHOOT). One or more gain values associated with each of these gain types are for example stored in registers 616, 618 of the controller 614. In some embodiments these registers 616, 618 are implemented in one or more non-volatile memory devices.

The selection of the tracking or overshoot gain is for example performed by a gain control circuit (GAIN CONTROL) 620, which for example receives the signal F_CTRL indicating a new target frequency.

The tracking gain "GAIN_TRACKING" is for example a fixed or variable gain chosen to ensure stability. For example, the closed-loop transfer function of the FLL is given by:

$$\frac{F(z)}{I(z)} = \frac{K_I K_{DCO}}{1 + (K_I K_{DCO} K_S - 1)z^{-1}}$$

where I(z) and F(z) are the Laplace transform of the input and the output respectively, $K_I$ is the tracking gain value, $K_{DCO}$ is the gain of the DCO 402 and $K_s$ is the gain of the frequency counter 410. The tracking gain value $K_I$ is for example chosen to ensure that:

$0 \le z_1 \le 1$ where $z_1$ is the pole of the closed-loop transfer function, as described in part 3.2 of the publication by S. Lesecq et al, mentioned in the background section above. A stability gain can be defined as the highest limit of the gain while maintaining stability, and corresponds to the point at which $z_1=1$.

In some embodiments, the tracking gain value is variable. For example, during a first iteration of the frequency transition, the tracking gain value takes one of a plurality of tracking gain values based on the frequency transition to be applied. For example, for each frequency transition, a corresponding initial tracking gain value is for example defined based on the stability gain mentioned above for that frequency transition. The stability gains for a number of frequency transitions are for example determined during a calibration phase of the frequency generator 108. The stability gain is the gain that, for a given frequency transition, would bring the frequency of the clock signal from its initial frequency to the target frequency in a single iteration of the PLL while maintaining stability. For example, for a frequency transition from a frequency F1 to a frequency F2, during the calibration phase, the settled values of the control signal C_FREQ for the clock frequencies F1 and F2 are for example determined to provide control signal C_FREQ_F1 and C_FREQ_F2 respectively. An ideal stability gain GAIN_STABILITY is then for example determined as:

GAIN_STABILITY=(C_FREQ_F2−C_FREQ_F1)/F_ERR(F1,F2)

where F_ERR(F1,F2) is the error signal equal to F2-F1. Of course, in practice, this ideal stability gain may be unstable and thus generate oscillations of the output frequency in view of variations in the behavior of the VCO resulting from temperature variations, aging, etc. Therefore, the corresponding tracking gain is for example equal to the ideal stability gain reduced by a reducing coefficient COEF_R to prevent overshoot, and instability. For example, the reducing coefficient COEF_R is equal to between 0.7 and 0.95, and for example around 0.9. After the initial tracking gain applied during the first iteration, a fixed tracking gain is for example applied thereafter until convergence to the target frequency F_T, this fixed tracking gain for example using a reducing coefficient COEF_R of between 0.2 to 0.7. Alternatively, in some embodiments, the initial tracking gain determined based on the ideal stability gain may continue to be applied until the frequency has converged to the target value.

On the contrary, the overshoot gain GAIN_OVERSHOOT is a gain value that is chosen to ensure overshoot when transitioning from a first frequency to a second frequency lower than the first frequency. For example, the overshoot gain is equal to the stability gain, determined as above, and multiplied by an increasing coefficient COEF_I chosen to ensure overshoot and thus instability. For example, the increasing coefficient COEF_I is equal to between 1.1 and 1.3, and for example around 1.15. The FLL is not rendered unstable by the overshoot gain if for example this gain is applied for a single iteration only.

Operation of the controller 614 of FIG. 6 will now be described in, more detail with reference to FIGS. 7 and 8.

Figure 7:
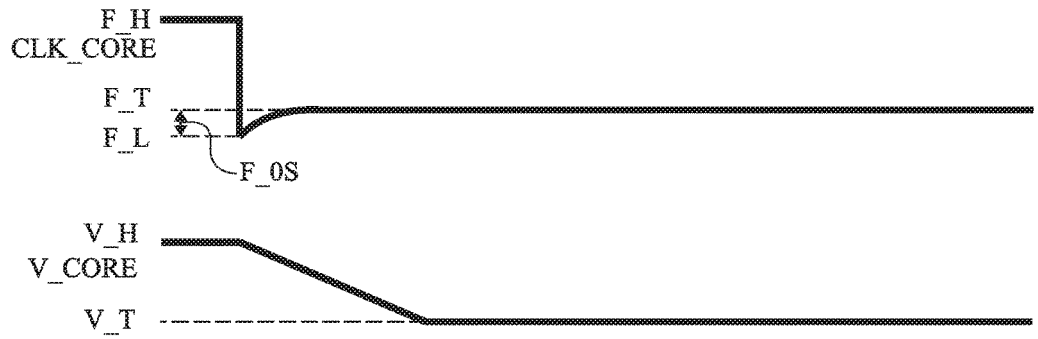
FIG. 7 is a timing diagram illustrating signals in the controller of FIG. 4 according to an example embodiment.

FIG. 7 is a timing diagram illustrating an example of the frequency of the core clock signal CLK_CORE and the supply voltage level V_CORE during a frequency/voltage transition according to an example embodiment. As with previous examples, it is assumed that the clock frequency is initially at a level F_H and is to fall to a target level F_T, and that the voltage is initially at a level V_H and is to fall to a target level V_T.

During the first iteration of the frequency transition, the frequency of the clock signal CLK_CORE is brought directly from the level F_H to a level F_L below the target frequency F_T using the overshoot gain GAIN_OVERSHOOT. For example, the frequency F_L is an overshoot frequency F_OS below the target frequency F_T, in other words F_L=F_T−F_OS, wherein F_OS is between 10 and 30 percent of initial frequency error F_H F_T.

During a subsequent iteration of the frequency transition, the tracking gain (GAIN_TRACKING) is applied, and thus the frequency of the clock signal CLK_CORE converges towards the target frequency F_T, while never exceeding the target frequency F_T. However, as represented in FIG. 7, the supply voltage V_CORE can be reduced from the value V_H to the V_T shortly after the iteration of the controller 614 in view of the fact that the frequency will thereafter remain lower than or equal to the target frequency F_T.

Figure 8:
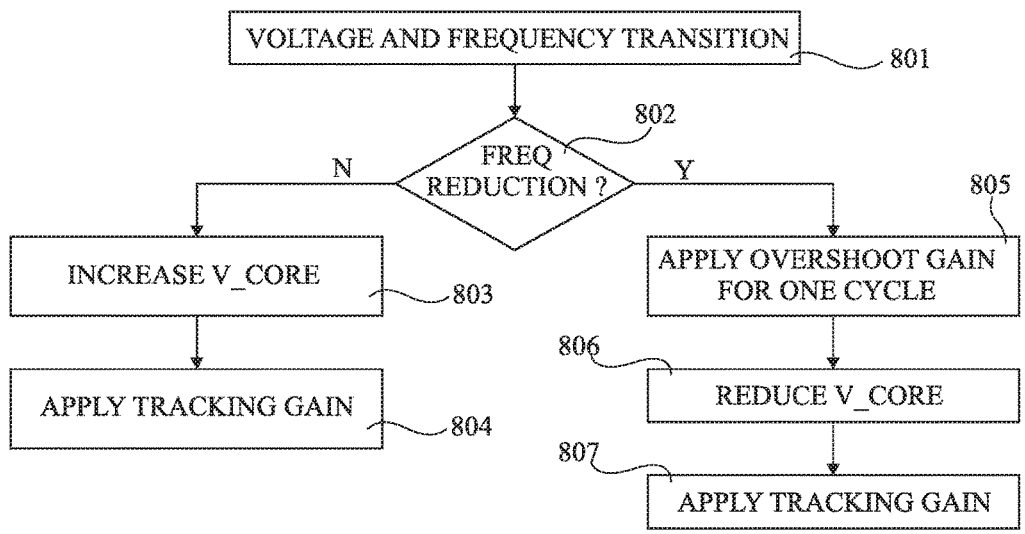
FIG. 8 is a flow diagram illustrating operations in a method of implementing a voltage and frequency transition.

FIG. 8 is a flow diagram illustrating an example of operations in a method of implementing a frequency/voltage transition according to an embodiment of the present disclosure. These operations are for example implemented by the controller 614 and gain control circuit 620 of FIG. 6, and by the voltage generator 106 of FIG. 1.

In an operation 801, the gain control circuit 620 for example determines when a voltage and frequency transition is to take place.

In an operation 802, the gain control circuit 620 for example identifies when the transition is a frequency reduction. In particular, the gain control circuit 620 for example compares the new target frequency indicated by the frequency control signal F_CTRL with the current target frequency.

If the frequency transition is not a frequency reduction, an operation 803 is for example performed in which the supply voltage V_CORE is increased. Then, in an operation 804, the gain control circuit 620 for example controls the controller 614 to apply a tracking gain in order to perform the frequency transition. This for example ensures that the target frequency is not exceeded during convergence towards the target frequency.

Alternatively, if it is determined in operation 802 that the frequency transition to be applied is a frequency reduction, an operation 805 is performed. In operation 805, the gain control circuit 620 for example controls the controller 614 to apply an overshoot gain for the first iteration of the frequency transition, such that the frequency is brought below the new target frequency. Then, in an operation 806, the supply voltage V_CORE of the processing core is for example reduced to the target voltage V_T. The gain control circuit 620 then for example controls the controller 614 to apply a tracking gain in an operation 807, where the tracking gain for example ensures convergence towards, the target frequency F_T without further overshoot.

An advantage of the embodiments described herein is that, during a voltage and frequency transition in a DVFS system, the frequency is brought down, in a single iteration of the FLL, to a level below the target frequency. It is thus possible to reduce the supply voltage before convergence of the FLL is complete, leading to improved power efficiency.

Having thus described at least one illustrative embodiment, various alterations, modifications and improvements will readily occur to those skilled in the art. For example, while examples of the tracking gains have been described according, to one specific embodiment, other gain control algorithms could be used that ensure no overshoot.

What is claimed is:

1. A circuit comprising:
    a voltage generator (106) adapted to generate a variable supply voltage (V_CORE) for powering a processing core (102);
    a frequency generator (108) adapted to generate a variable frequency clock signal (CLK_CORE) of the processing core, wherein the frequency generator comprises a frequency locked loop (400) comprising:
    a digitally controlled oscillator (402) configured to generate the variable frequency clock signal (CLK_CORE); and
    a controller (614) configured to generate a digital control signal (C_FREQ) for controlling the digitally controlled oscillator (402) based on the product of a frequency error signal (F_ERR) and a gain, wherein the controller is configured to implement a frequency transition of the variable frequency clock signal (CLK_CORE) from a first frequency (F_H) to a second frequency (F_T) lower than the first frequency by generating:
    a first value of the digital control signal (C_FREQ) based on a first value of the gain applied to a first value of the frequency error signal (F_ERR) to apply a first reduction in the frequency of the variable frequency clock signal to a third frequency (F_L) lower than the second frequency (F_T); and
    further values of the digital control signal (C_FREQ) based on one or more further gain values different to and lower than the first value of the gain, wherein the controller (614) is configured to apply said further gain values selected such that the second frequency (F_T) is not exceeded by the variable frequency clock signal, wherein the voltage generator (106) is configured to implement a voltage transition from a first level of the variable supply voltage (V_CORE) to a second level lower than the first level following said first frequency reduction.

2. The circuit of claim 1, wherein the controller (614) is adapted to apply the first value of the gain that causes an overshoot (F_OS) of between 10 and 30 percent of the frequency difference between the first and second frequencies (F_H, F_T).

3. The circuit of claim 1, further comprising:
a frequency counter (410) configured to generate an estimate (F_EST) of the frequency of the variable frequency clock signal (CLK_CORE) based on a reference clock signal (CLK_REF); and
a subtractor (412) adapted to generate the frequency error signal (F_ERR) by subtracting the frequency estimate (F_EST) from the second frequency (F_T).

4. The circuit of claim 1, wherein the digitally controlled oscillator (402) comprises a digital to analog converter (404) and a voltage controlled oscillator (406).

5. The circuit of claim 1, further comprising a gain control circuit (620) adapted to receive a frequency control signal (F_CTRL) indicating the second frequency (F_T) and to determine when the frequency transition is a frequency reduction.

6. The circuit of claim 5, wherein the gain control circuit (620) is configured to detect when a frequency transition is not a frequency reduction and in response to cause the controller (616) to apply a gain value not leading to overshoot of the second frequency (F_T).

7. An electronic device (100) comprising:
said processing core (102); and
the circuit of claim 1 adapted to provide the variable supply voltage (V_CORE) and variable frequency clock signal (CLK_CORE) to the processing core (102).

8. A method of performing a voltage and frequency transition of a processing core (102), the method comprising:
implementing, by a controller (614) of a frequency locked loop (400), a frequency transition of a variable frequency clock signal (CLK_CORE) from a first frequency (F_H) to a second frequency (F_T) lower than the first frequency by generating:
a first value of a digital control signal (C_FREQ) based on a first gain value applied to a first value of a frequency error signal (F_ERR) to apply a first reduction in the frequency of the variable frequency clock signal to a third frequency (F_L) lower than the second frequency (F_T); and
further values of the digital control signal (C_FREQ) based on one or more further gain values different to and lower than the first value of the gain, wherein the controller (614) is configured to apply said further gain values selected such that the second frequency (F_T) is not exceeded by the variable frequency clock signal;
applying said digital control signals to a digitally controlled oscillator (402) to generate the variable frequency clock signal (CLK_CORE); and
implementing, by a voltage generator (106) adapted to generate a variable supply voltage (V_CORE) for powering the processing core (102) a voltage transition from a first level of the variable supply voltage (V_CORE) to a second level lower than the first level following said first frequency reduction.

9. A circuit comprising:
a voltage generator (106) adapted to generate a variable supply voltage (V_CORE) for powering a processing core (102);
a frequency generator (108) adapted to generate a variable frequency clock signal (CLK_CORE) of the processing core, wherein the frequency generator comprises a frequency locked loop (400) comprising:
a digitally controlled oscillator (402) configured to generate the variable frequency clock signal (CLK_CORE); and
a controller (614) configured to generate a digital control signal (C_FREQ) for controlling the digitally controlled oscillator (402) based on the product of a frequency error signal (F_ERR) and a gain, wherein the controller is configured to implement a frequency transition of the variable frequency clock signal (CLK_CORE) from a first frequency (F_H) to a second frequency (F_T) lower than the first frequency by generating:
a first value of the digital control signal (C_FREQ) based on a first value of the gain applied to a first value of the frequency error signal (F_ERR) to apply a first reduction in the frequency of the variable frequency clock signal to a third frequency (F_L) lower than the second frequency (F_T), wherein the controller (614) is adapted to apply the first value of the gain that causes an overshoot (F_OS) of between 10 and 30 percent of the frequency difference between the first and second frequencies (F_H, F_T); and
further values of the digital control signal (C_FREQ) based on one or more further gain values different to and lower than the first value of the gain, wherein the controller (614) is configured to apply said further gain values selected such that the second frequency (F_T) is not exceeded by the variable frequency clock signal.

10. A circuit comprising:
a voltage generator (106) adapted to generate a variable supply voltage (V_CORE) for powering a processing core (102);
a frequency generator (108) adapted to generate a variable frequency clock signal (CLK_CORE) of the processing core, wherein the frequency generator comprises a frequency locked loop (400) comprising:
a digitally controlled oscillator (402) configured to generate the variable frequency clock signal (CLK_CORE); and
a controller (614) configured to generate a digital control signal (C_FREQ) for controlling the digitally controlled oscillator (402) based on the product of a frequency error signal (F_ERR) and a gain, wherein the controller is configured to implement a frequency transition of the variable frequency clock signal (CLK_CORE) from a first frequency (F_H) to a second frequency (F_T) lower than the first frequency by generating:
a first value of the digital control signal (C_FREQ) based on a first value of the gain applied to a first value of the frequency error signal (F_ERR) to apply a first reduction in the frequency of the variable frequency clock signal to a third frequency (F_L) lower than the second frequency (F_T); and
further values of the digital control signal (C_FREQ) based on one or more further gain values different to and lower than the first value of the gain, wherein the controller (614) is configured to apply said further gain values selected such that the second frequency (F_T) is not exceeded by the variable frequency clock signal;
a frequency counter (410) configured to generate an estimate (F_EST) of the frequency of the variable frequency clock signal (CLK_CORE) based on a reference clock signal (CLK_REF); and a subtractor (412) adapted to generate the frequency error signal (F_ERR) by subtracting the frequency estimate (F_EST) from the second frequency (F_T).

\* \* \* \* \*